United States Patent
Kaufman

(10) Patent No.: US 11,418,172 B2
(45) Date of Patent: Aug. 16, 2022

(54) TWO-TERMINAL PROTECTIVE DEVICE USING PARASITIC ENERGY HARVESTING

(71) Applicant: Generac Power Systems, Inc., Waukesha, WI (US)

(72) Inventor: Joshua Daniel Kaufman, Gorham, ME (US)

(73) Assignee: Generac Power Systems, Inc., Waukesha, WI (US)

( * ) Notice: Subject to any disclaimer, the term of this patent is extended or adjusted under 35 U.S.C. 154(b) by 0 days.

(21) Appl. No.: 17/261,792

(22) PCT Filed: Aug. 14, 2019

(86) PCT No.: PCT/US2019/046488
§ 371 (c)(1),
(2) Date: Jan. 20, 2021

(87) PCT Pub. No.: WO2020/037034
PCT Pub. Date: Feb. 20, 2020

(65) Prior Publication Data
US 2021/0265984 A1    Aug. 26, 2021

Related U.S. Application Data

(60) Provisional application No. 62/718,700, filed on Aug. 14, 2018.

(51) Int. Cl.
*H03K 3/012* (2006.01)
*H02S 40/36* (2014.01)
*H02J 50/00* (2016.01)

(52) U.S. Cl.
CPC ............ *H03K 3/012* (2013.01); *H02J 50/001* (2020.01); *H02S 40/36* (2014.12)

(58) Field of Classification Search
CPC ............ H03K 3/012; H03K 17/08122; H03K 17/08128; H03K 2217/0081; H02J 50/001; H02S 40/36; H02S 40/30
See application file for complete search history.

(56) References Cited

U.S. PATENT DOCUMENTS 10,075,064 B2    9/2018  Perreault et al.
2009/0309538 A1  12/2009  Xu
(Continued)

FOREIGN PATENT DOCUMENTS

WO    2020037034    2/2020

OTHER PUBLICATIONS

"International Application Serial No. PCT US2019 046488, International Search Report dated Nov. 22, 2019", 5 pgs.
(Continued)

*Primary Examiner* — Sibin Chen
(74) *Attorney, Agent, or Firm* — Schwegman Lundberg & Woessner, P.A.

(57) ABSTRACT

A two-terminal electrical protective device operates by harvesting energy from a small but non-zero voltage drop across a closed solid-state switch. From a default, open-circuit state, the device is remotely triggered by an AC signal to enter the desired conductive state. Power scavenged by an energy harvesting circuit while the device is in the conductive state, powers a gate drive circuit to hold the device in the conductive state for as long as current flows. When current stops, the device returns to the default open-circuit state.

15 Claims, 3 Drawing Sheets

(56) References Cited

U.S. PATENT DOCUMENTS

| | | | |
|---|---|---|---|
| 2010/0296210 A1* | 11/2010 | Ball | H01L 29/7808 361/56 |
| 2011/0181115 A1 | 7/2011 | Ivanov | |
| 2011/0242865 A1 | 10/2011 | Robbins | |
| 2011/0273917 A1 | 11/2011 | Maitra et al. | |
| 2012/0081934 A1 | 4/2012 | Garrity et al. | |
| 2012/0199172 A1* | 8/2012 | Avrutsky | H02J 7/007 327/419 |
| 2012/0300347 A1 | 11/2012 | Fahrenbruch et al. | |
| 2013/0002045 A1 | 1/2013 | Hassan-ali et al. | |
| 2016/0164457 A1* | 6/2016 | Robbins | H02J 3/46 307/80 |
| 2017/0005564 A1* | 1/2017 | Somani | H02M 3/00 |
| 2017/0133938 A1 | 5/2017 | Tiefnig | |
| 2017/0230048 A1 | 8/2017 | Nilles et al. | |
| 2017/0288384 A1 | 10/2017 | Loewenstern et al. | |
| 2018/0278039 A1 | 9/2018 | Reddy Kambham et al. | |
| 2018/0360312 A1 | 12/2018 | Gupta et al. | |
| 2018/0366945 A1 | 12/2018 | Braginsky et al. | |
| 2020/0076199 A1 | 3/2020 | Kaufman et al. | |
| 2020/0144839 A1 | 5/2020 | De Vos et al. | |

OTHER PUBLICATIONS

"International Application Serial No. PCT US2019 046488, Written Opinion dated Nov. 22, 2019", 9 pgs.

"International Application Serial No. PCT US2019 046488, International Preliminary Report on Patentability dated Feb. 25, 2021", 11 pgs.

"European Application Serial No. 19759823.8, Response to Communication pursuant to Rules 161(1) and 162 EPC filed Sep. 23, 2021", 28 pgs.

"U.S. Appl. No. 16/561,977, Preliminary Amendment filed Sep. 9, 2019", 3 pgs.

"U.S. Appl. No. 16/561,977, Non Final Office Action dated Sep. 4, 2020", 22 pgs.

"U.S. Appl. No. 16/561,977, Response filed Dec. 4, 2020 to Non Final Office Action dated Sep. 4, 2020", 11 pgs.

"U.S. Appl. No. 16/561,977, Final Office Action dated Mar. 26, 2021", 23 pgs.

"U.S. Appl. No. 16/561,977, Response filed May 26, 2021 to Final Office Action dated Mar. 26, 2021", 12 pgs.

"U.S. Appl. No. 16/561,977, Advisory Action dated Jul. 8, 2021", 3 pgs.

"U.S. Appl. No. 16/561,977, Applicant Interview Summary filed Aug. 9, 2021", 2 pgs.

"U.S. Appl. No. 16/561,977, Non Final Office Action dated Oct. 29, 2021", 12 pgs.

"U.S. Appl. No. 16/561,977, Response filed Jan. 18, 2022 to Non Final Office Action dated Oct. 29, 2021", 9 pgs.

"U.S. Appl. No. 16/561,977, Non Final Office Action dated May 12, 2022", 26 pgs.

* cited by examiner

TWO-TERMINAL PROTECTIVE DEVICE USING PARASITIC ENERGY HARVESTING

RELATED APPLICATION

This application is a U.S. National Stage Filing under 35 U.S.C. 371 of International Patent Application Serial No. PCT/US2019/046488, filed Aug. 14, 2019, and published as WO 2020/037034 A1 on Feb. 20, 2020, which application claims priority to U.S. Provisional Application Ser. No. 62/718,700 (entitled TWO-TERMINAL PROTECTIVE DEVICE USING PARASITIC ENERGY HARVESTING, filed Aug. 14, 2018) which application and publication are incorporated herein by reference in their entirety.

BACKGROUND

By their nature, photovoltaic (PV) solar arrays and energy storage battery stacks present continuous voltage and significant available power at their terminals, and so it may be desirable to provide switching capability, to meet safety or compliance needs. This can be accomplished with active switching devices or electromechanical contactors, but these devices require extra wiring and may involve significant continuous power consumption to operate.

Among solid-state devices, Silicon-controlled rectifiers (SCRs) have the capability of latching current conduction for as long as the current flow continues. However, they typically present over 1.5V of voltage drop across the device, which causes significant and unacceptable power loss in many applications. Other solid-state switches (e.g. MOSFETs, IGBTs and BJTs) can have significantly lower voltage drop resulting in higher efficiency system designs, but they don't exhibit latching behavior and so must be continuously powered.

SUMMARY

A two-terminal electrical protective device operates by harvesting energy from a small but non-zero voltage drop across a closed solid-state switch. From a default, open-circuit state, the device is remotely triggered by an AC signal to enter the desired conductive state. Power scavenged by an energy harvesting circuit while the device is in the conductive state, powers a gate drive circuit to hold the device in the conductive state for as long as current flows. When current stops, the device returns to the default open-circuit state.

Advantages of various embodiments may include very low power consumption, low series resistance, and avoidance of the need for separate conductors to drive the switch, which may be remotely located.

A two-terminal device with low voltage drop can be triggered remotely into a conductive mode and latched in the 'on' state until current flow ceases.

In addition to solar and battery applications, other potential applications include remote disconnection for DC distribution networks.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized, and that structural, logical and electrical changes may be made without departing from the scope of the present invention. The following description of example embodiments is, therefore, not to be taken in a limited sense, and the scope of the present invention is defined by the appended claims.

Figure 1:
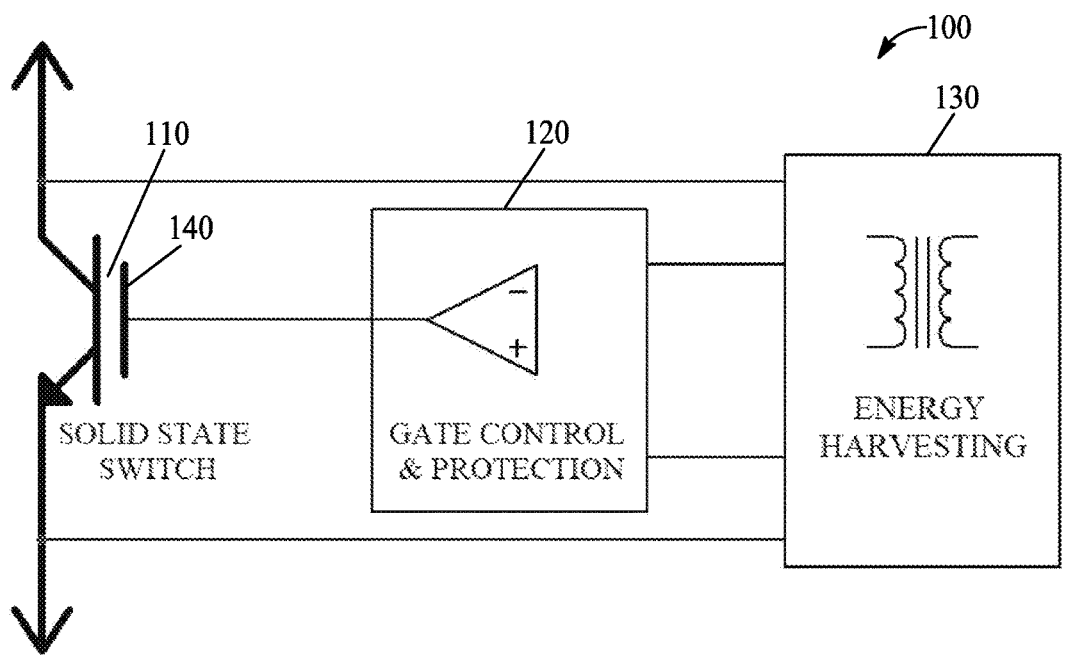
FIG. 1 is a functional block diagram of a device having a high-current solid-state switch, an energy harvesting circuit powered by the voltage drop across the switch, and a gate drive and protection circuit controlling the solid-state switch.

FIG. 1 is a block diagram of one embodiment of a protection circuit 100 controlling a switch 100. Circuit 100 may be referred to as a device in a product form, and may include an enclosure for the circuitry shown in FIG. 1. Current flow is controlled in circuit 100 by the solid-state switch 110, for instance a MOSFET, IGBT or BJT. The current flow is indicated by arrows on the conductors on either side of the switch. Even in the on state, the switch has some nonzero voltage drop across it, and therefore energy can be harvested as indicated by an energy harvesting circuit 130 coupled across the switch 110. The energy harvesting circuit 130 creates a supply at a sufficient voltage to power a gate control and protection circuit 120, which in turn drives the gate 140 of the switch 110 to the 'on' state.

In an initial high-impedance 'off' state, no energy is harvested, and the gate 140 voltage is too low to turn on the switch 110. An AC signal, typically a current between 1 mA and 1 A at 10 kHz up to 10 MHz, may be applied through the circuit 100 (or through a number of such devices connected in series). Although the circuit 100 is high impedance to DC current, it may be configured to allow a high frequency AC current signal to pass through for activation. The AC signal activates the energy harvesting circuit 130 to power the gate control circuit 120, which drives the switch 110 to the on state. The energy harvesting circuit 130 harvests sufficient power from the steady-state voltage drop across the switch 110 (while the switch is 'on' and conductive) to power the gate control and protection circuit, latching the device in the low-impedance state to the current flow indicated by the arrows.

The control terminal of the solid-state switch may be regulated by, a feedback circuit involving op-amps and/or transistors to maintain sufficient voltage drop across the device for the energy harvesting circuit to operate. In one embodiment, the voltage across the solid-state switch is amplified and fed into the control terminal e.g. the gate of the switch, such as a MOSFET. In this way, the circuit 100 can stay powered even with very small current through the switch 110.

Figure 5:
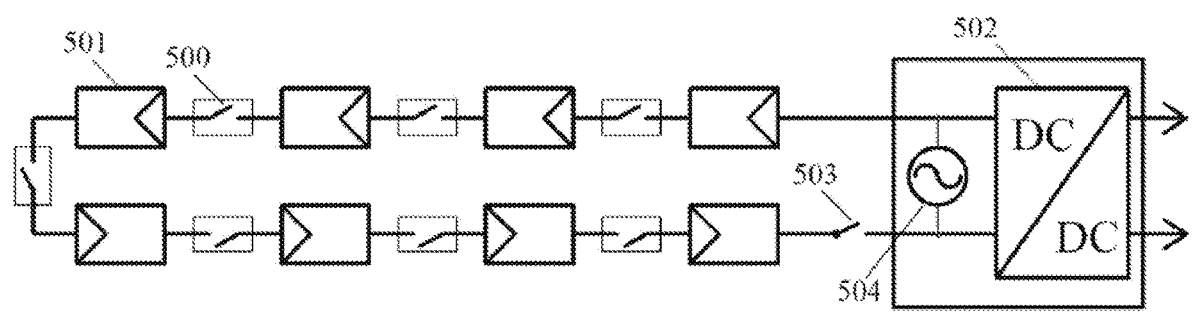
FIG. 5 is an example implementation in a PV power system.

In the event of a shutdown signal or other need to return the circuit 100 to the high impedance state, the current flow is stopped, such as bringing the current flow to zero or at least low enough to place the switch 110 in the high impedance state. In one or more embodiments, a master switch, such as a remote power converter, conveniently-located switch (e.g. 503 in FIG. 5), circuit breaker, or fuse opens, whereupon the energy harvest circuit ceases operation, and the device latches in the high-impedance state. As shown in FIG. 5, the remote power converter 502 may be a DC optimizer or inverter into which the string of PV or other voltage sources feeds. Any mechanism that stops the current flow is then able to put the disconnect switches back into the high impedance state.

Figure 2:
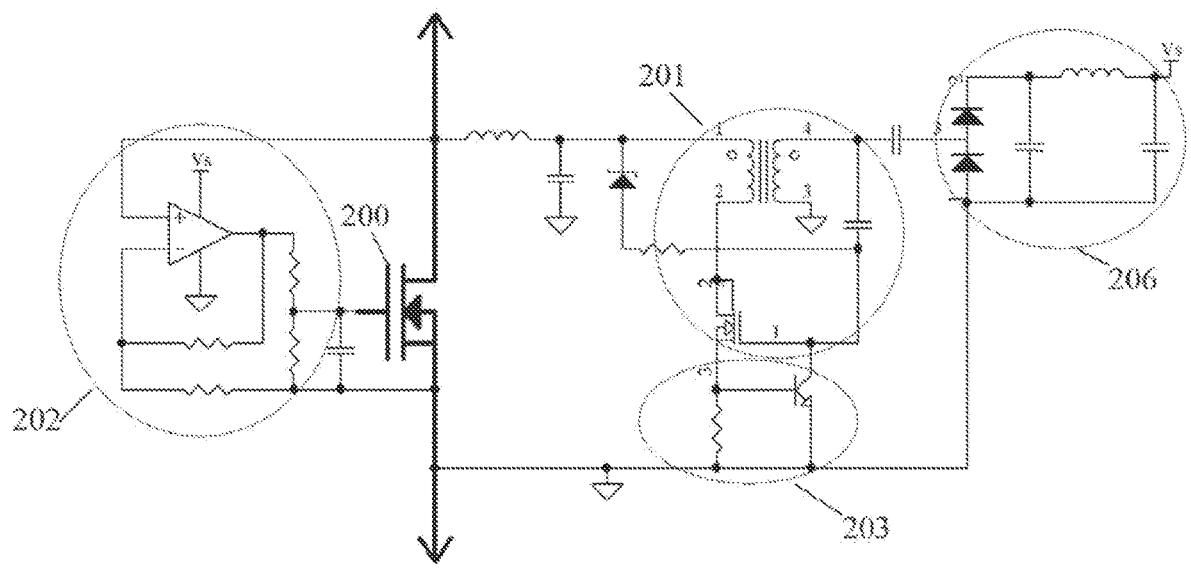
FIG. 2 is a schematic diagram of a two terminal protection circuit.

FIG. 2 is a schematic diagram of one embodiment of the device. This implementation uses a resonant converter 201 with high-turns-ratio transformer, typically 1:50 to 1:200, for converting the tens to hundreds of millivolts drop across the device into a supply voltage of several volts, Vs, sufficient to drive the switch control signal of the primary switch 200. An op amp circuit 202 controls the gate of the primary switch 200 and is configured to maintain a substantially constant voltage drop across the transistor.

A challenge solved by this design is that the energy harvesting converter should effectively operate over a wide range of input voltages. A switching converter designed to operate at a few tenths of a volt may suffer overcurrent at tens of volts. In one embodiment, high speed overcurrent protection is provided for the main energy harvesting converter 201. FIG. 2 shows how this can be accomplished with a bipolar transistor with the base connected to a current sense resistor 203 (and 303 in FIG. 3). The rectifier circuit 206 (and 306 in FIG. 3) converts the AC output of the transformer to a DC supply for powering the gate control circuit 202 (and 302 in FIG. 3).

Figure 3:
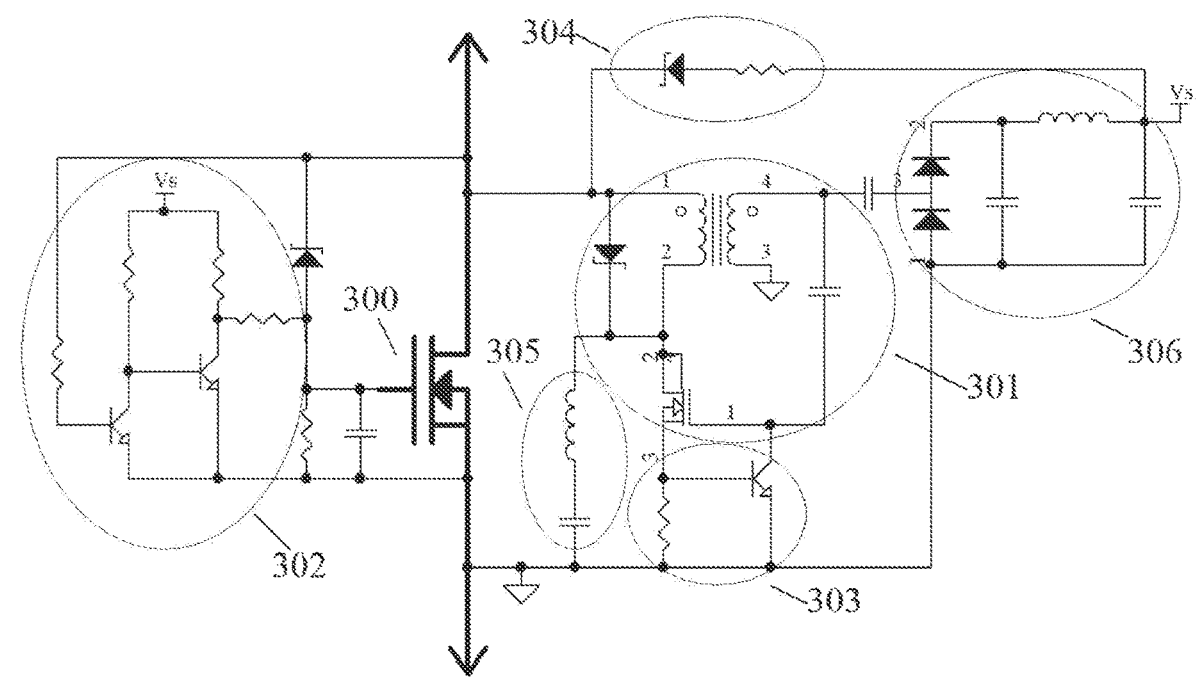
FIG. 3 is a schematic diagram of an alternative embodiment of of a two terminal protection device having a low-cost gate drive circuit, overvoltage protection, and resonant signal filter.

Another challenge solved by one or more embodiments is how to avoid the use of unnecessarily high-voltage power silicon which increases cost and reduces efficiency. The danger to the solid-state switch product is that a series-string of voltage sources and disconnect switches would apply the entire string voltage to a single switch in the condition that only one switch is in the 'off' state. However, using switches rated for the entire string voltage would compromise the system efficiency and cost. One potential solution to this problem is to have switches immediately turn on before they avalanche. This can be achieved with a Zener diode 304 to trigger the energy harvesting power converter 301 as shown in FIG. 3. FIG. 3 also features a Zener diode coupled to a gate drive circuit 302 used to directly turn the switch on. In some embodiments a single Zener diode achieves both functionalities.

One function of a disconnect system is the ability to simultaneously trigger multiple disconnects in a series or series-parallel string to cause them to change state. One approach for causing the disconnects to change to the low impedance state is to apply a small AC current signal to the series string. Although the string is high impedance to DC current, a small amount of AC current can pass through and be used to activate the energy harvesting circuit. This AC current can pass through a low impedance capacitor or a band-pass filter to reduce the chances of unintentional activation. FIG. 3 includes a resonant signal filter 305 to help prevent the switch from turning on in the presence of noise. Once the energy harvesting circuit has been activated it will continue to operate and keep the switch in the conductive state.

To cause the disconnects to return to the high impedance state, the string current is reduced to below the level required to maintain the energy harvesting convertor 301, typically a few milliamps. It then shuts down and the solid-state switches latch in a high impedance state.

FIG. 3 also presents a lower-cost gate drive circuit incorporating inexpensive bipolar transistors 302 instead of an op amp.

Figure 4:
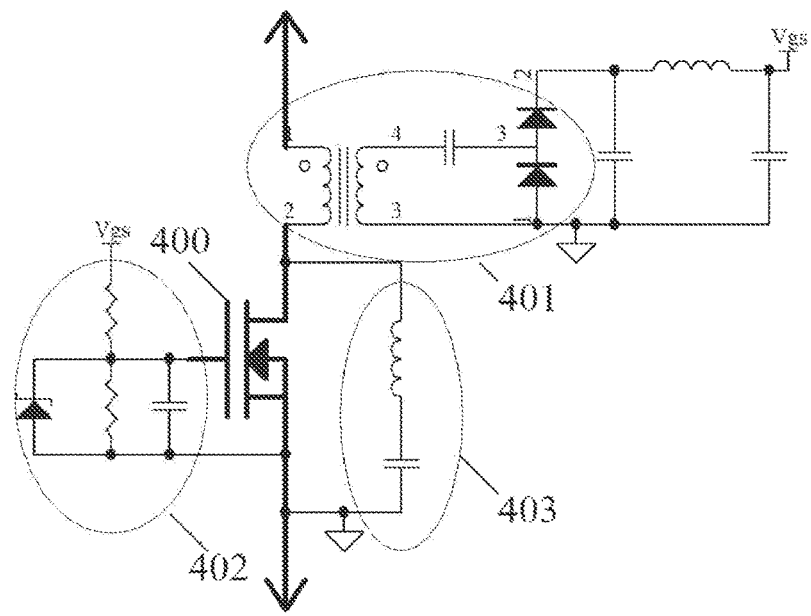
FIG. 4 is a schematic diagram of a two terminal protection circuit utilizing continuous signaling.

FIG. 4 shows a simplified design utilizing continuous signaling to maintain the switch in a low impedance state. A series transformer 401 picks up a continuous signal to create a power source that uses a gate drive network 402 to maintain the solid-state switch 400 in its on state. A filter circuit 403 limits the frequencies that can be used to activate the power supply circuit.

Most or all of the energy harvesting and control circuitry could be incorporated into an ASIC for smaller size and lower cost. This ASIC could incorporate more advanced decoding, such as FSK (frequency shift keying) data, for robustness against noise.

A challenge of the solar photovoltaic industry is to meet PV Rapid Shutdown requirements effectively prescribing that every solar PV module be separately disconnected during emergency shutdown events. One approach is to put a power converter on every module which increases cost and reduces reliability and safety. String inverters accept power input from many, modules reducing the system cost but are unable to disconnect every module from each other as required by new codes. FIG. 5 demonstrates a solution that uses multiple switches 500 described above to allow string inverters or DC optimizers 502 to disconnect each module 501 without the addition of expensive power converters. An AC signal generator 504 may be used to either power the energy harvester or transition the switches to a low impedance state for the various embodiments described above.

Examples

1. An electrical circuit comprising: a switch, an energy harvesting circuit coupled to the switch to collect power from the voltage drop across the switch; and a control circuit coupled to the energy harvesting circuit to maintaining the switch in an 'on' state.

2. The circuit of example 1 wherein the control circuit controls the solid-state switch to maintain a minimum voltage for feeding the energy harvesting circuit over a wide range of currents through the switch comprising a solid-state switch.

3. An electrical circuit comprising: at least one solid-state switch; an energy harvesting circuit for collecting power from the AC current passing through the at least one solid-state switch; and a control circuit for maintaining the at least one of the solid-state switches in an 'on' state.

4. A method comprising using a series disconnect switch for a DC power system and activating the series disconnect switch via an AC signal passing through a DC series string of the DC power system.

5. The method of example 4 where the disconnect switch latches into a conductive state until current flow through it ceases.

6. The method of any of examples 5-4 where the disconnect switch remains in a conductive state while the AC signal current is present.

7. A method of protecting a low-voltage solid-state switch in a high-voltage series string by putting the switch into a conductive state.

8. An electrical circuit comprising a switch having an input, output, and control gate; an energy harvesting circuit coupled to the input and output of solid-state switch to collect power from a voltage drop across the solid-state switch; and a gate control circuit coupled to the energy harvesting circuit and the control gate of the switch to maintain the switch in an 'on' state in response to power received from the energy harvesting circuit.

9. The circuit of example 8 wherein the gate control circuit controls the switch to maintain a minimum voltage for feeding the energy harvesting circuit over a wide range of currents through the switch.

10. The circuit of any of examples 8-9 wherein the switch is in an open state with no voltage applied to the control gate.

11. The circuit of any of examples 8-10 wherein the switch comprises a solid-state switch.

12. The circuit of any of examples 8-11 wherein the control circuit controls the switch to maintain a minimum voltage for feeding the energy harvesting circuit over a wide range of currents through the input and output of the switch.

13. The circuit of any of examples 8-12 wherein the energy harvesting circuit comprises a resonant converter having a turns ratio sufficient to convert the voltage drop for the control circuit to keep the switch in an on state while current is flowing through e switch.

14. The circuit of any of examples 8-13 and further comprising a zener diode coupled between the energy harvesting circuit and the input to cause the switch to turn on prior to avalanche.

15. The circuit of any of examples 8-14 and further comprising a rectifier coupled to the energy harvesting circuit that activates the energy harvesting circuit in response to an AC signal across the switch.

16. The circuit of any of examples 8-15 and further comprising a resonant filter coupled between the energy harvesting circuit and the switch to prevent turn on due to noise.

17. The circuit of any of examples 8-16 wherein the switch is configured to latch to a high impedance state in response to low current across the switch resulting in a low voltage at the gate of the switch.

18. A system comprising a plurality of photovoltaic (PV) modules coupled in series; a plurality of switches coupled between pairs of the PV modules in series, wherein at least one of the switches comprises a switch having a high impedance latchable state; an energy harvesting circuit coupled to the switch to collect power from the voltage drop across the switch; and a control circuit coupled to the energy harvesting circuit to maintaining the solid-state switch in an 'on' low impedance state.

19. The system of example 18 and further comprising a master switch coupled to the series string of PV modules and switches, the master switch capable of stopping current flow in the series string.

20. The system of example 19 wherein the switches latch to the high-impedance state in response to the master switch stopping current flow.

21. A method comprising harvesting energy from a disconnect switch while DC current is flowing through the switch; generating a supply voltage from the harvested energy; applying a voltage to a control gate of the disconnect switch, the supply voltage being generated by a control circuit coupled to the supply voltage; and placing the disconnect switch in a high impedance state in response to a lack of DC current flowing through the switch.

22. The method of example 21 and further comprising placing a disconnect switch in a conductive state in response to an AC signal applied to the disconnect switch.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. An electrical circuit comprising:
   a switch having an input, output, and control gate;
   an energy harvesting circuit coupled to the input and output of the switch to collect power from a voltage drop across the switch; and
   a gate control circuit coupled to the energy harvesting circuit and the control gate of the switch to maintain the switch in an 'on' state in response to power received from the energy harvesting circuit and to latch the switch off in response to no power being collected from the energy harvesting circuit.

2. The circuit of claim 1 wherein the gate control circuit controls the switch to maintain a minimum voltage for feeding the energy harvesting circuit over a wide range of currents through the switch.

3. The circuit of claim 1 wherein the switch is in an open state with no voltage applied to the control gate.

4. The circuit of claim 1 wherein the gate control circuit controls the switch to maintain a minimum voltage for feeding the energy harvesting circuit over a wide range of currents through the input and output of the switch.

5. The circuit of claim 1 wherein the energy harvesting circuit comprises a resonant converter having a turns ratio sufficient to convert the voltage drop for the gate control circuit to keep the switch in an on state while current is flowing through the switch.

6. The circuit of any of claims 1 and further comprising a zener diode coupled between the energy harvesting circuit and the input to cause the switch to turn on prior to avalanche.

7. The circuit of any of claims 1 and further comprising a rectifier coupled to the energy harvesting circuit that activates the energy harvesting circuit in response to an AC signal across the switch.

8. The circuit of any of claims 1 and further comprising a resonant filter coupled between the energy harvesting circuit and the switch to prevent turn on due to noise.

9. The circuit of any of claims 1 wherein the switch comprises a solid-state switch.

10. The circuit of any of claims 1 wherein the switch is configured to latch to a high impedance state in response to low current across the switch resulting in a low voltage at the gate of the switch.

11. A system comprising:
    a plurality of photovoltaic (PV) modules coupled in series;
    a plurality of switches coupled between pairs of the PV modules in series, wherein at least one of the switches comprises:
    a switch having a high impedance latchable state;
    an energy harvesting circuit coupled to the switch to collect power from the voltage drop across the switch; and
    a control circuit coupled to the energy harvesting circuit to maintain the solid-state switch in an 'on' low impedance state and to latch the switch off in the high impedance state in response to no power being collected from the energy harvesting circuit.

12. The system of claim 11 and further comprising a master switch coupled to the series string of PV modules and switches, the master switch capable of stopping current flow in the series string.

13. The system of claim 12 wherein the switches latch to the high-impedance state in response to the master switch stopping current flow.

14. A method comprising:
   harvesting energy from a disconnect switch while DC current is flowing through the switch;
   generating a supply voltage from the harvested energy;
   applying a voltage to a control gate of the disconnect switch, the voltage being generated by a control circuit coupled to the supply voltage; and
   latching the disconnect switch in a high impedance state in response to a lack of DC current flowing through the switch.

15. The method of claim 14 and further comprising placing the disconnect switch in a conductive state in response to an AC signal applied to the disconnect switch, the disconnect switch comprising a solid-state switch.

\* \* \* \* \*

UNITED STATES PATENT AND TRADEMARK OFFICE
CERTIFICATE OF CORRECTION

PATENT NO. : 11,418,172 B2
APPLICATION NO. : 17/261792
DATED : August 16, 2022
INVENTOR(S) : Joshua Daniel Kaufman Page 1 of 1

It is certified that error appears in the above-identified patent and that said Letters Patent is hereby corrected as shown below:

In the Claims

In Column 6, Line 36, in Claim 6, delete "any of claims" and insert --claim-- therefor In Column 6, Line 40, in Claim 7, delete "any of claims" and insert --claim-- therefor In Column 6, Line 44, in Claim 8, delete "any of claims" and insert --claim-- therefor In Column 6, Line 47, in Claim 9, delete "any of claims" and insert --claim-- therefor In Column 6, Line 49, in Claim 10, delete "any of claims" and insert --claim-- therefor Signed and Sealed this
Twenty-seventh Day of December, 2022

Katherine Kelly Vidal
*Director of the United States Patent and Trademark Office*